(12) United States Patent
Metaye et al.

(10) Patent No.: US 9,109,296 B2
(45) Date of Patent: Aug. 18, 2015

(54) METHOD FOR ETCHING CONDUCTIVE METAL OXIDE LAYER USING MICROELECTRODE

(75) Inventors: Romain Metaye, Paris (FR); Federico Grisotto, Bailly (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 148 days.

(21) Appl. No.: 13/637,003

(22) PCT Filed: Mar. 25, 2011

(86) PCT No.: PCT/EP2011/054653
§ 371 (c)(1),
(2), (4) Date: Oct. 2, 2012

(87) PCT Pub. No.: WO2011/117407
PCT Pub. Date: Sep. 29, 2011

(65) Prior Publication Data
US 2013/0020115 A1    Jan. 24, 2013

(30) Foreign Application Priority Data

Mar. 26, 2010  (FR) ...................................... 10 52227

(51) Int. Cl.
*C25F 3/12* (2006.01)
*C25F 3/14* (2006.01)
*H01L 31/0224* (2006.01)

(52) U.S. Cl.
CPC ... *C25F 3/12* (2013.01); *C25F 3/14* (2013.01); *H01L 31/022466* (2013.01)

(58) Field of Classification Search
CPC ................. C25F 3/02; C25F 3/12; C25F 3/14
USPC .................................................. 205/640–686
See application file for complete search history.

(56) References Cited

U.S. PATENT DOCUMENTS

| 5,149,404 A | 9/1992 | Blonder et al. |
| 5,641,391 A | 6/1997 | Hunter et al. |
| 2003/0149122 A1 | 8/2003 | Bureau et al. |
| 2004/0140227 A1* | 7/2004 | Mazzara et al. .............. 205/666 |
| 2005/0115670 A1* | 6/2005 | Bettinelli et al. ........ 156/345.11 |
| 2006/0141156 A1 | 6/2006 | Viel et al. |
| 2010/0140104 A1* | 6/2010 | Murakami et al. ............ 205/652 |

FOREIGN PATENT DOCUMENTS

| FR | 2813208 A1 | 3/2002 |
| FR | 2851181 A1 | 8/2004 |

OTHER PUBLICATIONS

Acetic Acid, http://web.archive.org/web/20091202035602/http://en.wikipedia.org/wiki/Acetic_acid, Dec. 2, 2009, pp. 1-11.*

(Continued)

*Primary Examiner* — Nicholas A Smith
(74) *Attorney, Agent, or Firm* — Knobbe, Martens, Olson & Bear, LLP

(57) ABSTRACT

A method for etching a selected area of a conductive metal oxide layer deposited on a support is provided. The method comprises removing the area via electrochemical route in the presence of a polarized microelectrode and an electrochemical solution. In addition, an etched layer obtained with the foregoing method is provided.

20 Claims, 6 Drawing Sheets

(56) References Cited

OTHER PUBLICATIONS

Lin, et al., "High Resolution Photoelectrochemical Etching of n—GaAs with the Scanning Electrochemical and Tunneling Microsope", Journal of Electrochemical Society, Electrochemical Society, Manchester, New Hampshire, US, vol. 134, No. 4, Apr. 1, 1987, XP000840129.

Mandler, et al., "High Resolution Etching of Semiconductors by the Feedback Mode of the Scanning Electrochemical Microscope", Journal of Electrochemical Society, Electrochemical Society, Manchester, New Hampshire, US, vol. 137, No. 8, Aug. 1, 1990, XP000151183.

International Search Report issued on Jun. 14, 2011 for International Application No. PCT/EP2011/054653.

Cheng, et al., "ITO patterning by a low power Q-switched green laser and its use in the fabrication of a transparent flow meter", Journal of Micromechanics and Microengineering, 2007, vol. 17, pp. 2316-2323.

Wang, et al., "Toward mimicking biological vision with protein-based flexible imaging arrays", The International Society for Optical Engineering, 2006 in 3 pages.

Huang, et al., "The effect of solvent on the etching of ITO electrode", Materials Chemistry and Physics, 2004, vol. 84, pp. 146-150.

Chen, et al, "Laser direct write patterning technique of indium tin oxide film", Thin Solid Films, 2007, vol. 515, pp. 8515-8518.

Zucchi, et al., "White electroluminescence of lanthanide complexes resulting from exciplex formation", Journal of Materials Chemistry, 2010, vol. 20, pp. 2114-2120.

French Preliminary Search Report dated Nov. 9, 2010 to French Application No. 1052227—1 page.

\* cited by examiner

US 9,109,296 B2

METHOD FOR ETCHING CONDUCTIVE METAL OXIDE LAYER USING MICROELECTRODE

CROSS REFERENCE TO RELATED APPLICATIONS

This application is the U.S. National Phase of International Application No. PCT/EP2011/054653, filed Mar. 25, 2011, designating the U.S. and published as WO 2011/117407 on Sep. 29, 2011 which claims the benefit of French Patent Application No. 10 52227 filed Mar. 26, 2010.

TECHNICAL FIELD

The present invention pertains to the field of conductors and particularly conductors transparent in the visible and near infrared range, such as layers (or films) of tin-doped indium oxide or ITO (Indium-Tin Oxide) layers.

It more particularly concerns a method for etching a layer of conductive metal oxide in the presence of a microelectrode, and using suitably selected solutions to allow clean-cut, precise and reproducible etching of this layer.

BACKGROUND

ITO is a degenerate semiconductor of n type whose transparency in particular in the visible range is due to the large band gap of more than 3.5 eV. The electric conductivity of ITO results from the supply of charge carriers such as electrons on levels close to the bottom of the conduction band firstly through the creation of oxygen vacancies and secondly by substitution, in the crystalline lattice, of indium ions by tin ions.

Therefore thin ITO layers are electrically conductive and optically transparent in the visible range. Through these characteristics, they have found a broad field of applications as electrode material in all technologies requiring transparent and conductive electrodes. Among the applications in which ITO layers can be used, mention may be made of optically transparent sensors or detectors [1], bioelectronic sensors or detectors [2], the micro/nano-structuring of optical devices but also screen technology for touch screens, solar cells, liquid crystal displays, light-emitting diodes, organic light-emitting diodes, heating devices for glass panes, mirrors or lenses etc. . . .

These applications mostly require the etching of layers (or films) of ITO with the selective removal of part of these layers. For this purpose, it is possible to use either wet etching or dry etching processes.

Wet etching is widely used since it offers a rapid, low-cost process. This technique is based on photolithography to achieve removal of the surface of the substrate. It can be applied to large surfaces with good reproducibility. However, there are a certain number of disadvantages such as problems of selective etching at grain boundaries and isotropic etching i.e. etching produced in all spatial directions. Small variations in the layer generate ITO residues after etching and also cause lateral attack of the ITO layers. This may deteriorate the electrical properties of the ITO electrode and lead to non-controllable forms with respect to the edges of the etched ITO layer. In addition, wet etching requires the use of strong acid solutions such as halogenated acids or aqua regia which may damage the film or substrate on which the ITO layer was deposited [3]. Wet etching also requires the use of a mask to protect the regions of the ITO layer which are not to be removed. The use of a mask not only makes the process more cumbersome with the need for additional steps such as the preparation, placing in position and removal of the mask, but also increases the cost of the process.

Dry etching particularly uses the deposit of the ITO layer by sputtering over the mask, and serigraphy. Another simple and efficient dry etching method is laser etching which does not require the use of masks. The laser photoenergy causes vaporization of the ITO layer and hence clean patterning of the ITO layer. However, even if the ITO layer can be completely removed with a single laser pulse, the ITO vapour may redeposit, after etching, on the etched surface [4]. Also, the energy of the laser may damage the substrate (or support) on which the ITO layer was deposited.

Finally, whether wet or dry etching is used, the final resolution obtained is of the order of 1 µm. In other words, these methods allow etching (or relief features) of the ITO layer to be obtained having a minimum width of 1 µm.

Having regard to the current potential of ITO layers and the applications thereof, there is a true need for a method with which it is possible to etch ITO layers in reproducible, precise manner without damaging the substrate on which the ITO layer was deposited.

DESCRIPTION OF CERTAIN INVENTIVE ASPECTS

The present invention allows the solving of this technical problem and of the shortcomings of methods in the state of the art. More particularly, the present invention allows the solving of the previously listed technical problems using a microelectrode and an electrochemical solution for etching an ITO layer deposited on a solid substrate.

There are several advantages related to the use of a microelectrode for etching such a layer. Just like laser dry etching, this technique is implemented without a mask. Any pattern can be rapidly etched in particular when the microelectrode is coupled with a pattern program.

The use of a microelectrode allows a roll to roll process, but also a sheet by sheet process.

In addition, the use of a microelectrode makes it possible to obtain a clean-cut etching with cuts having straight edges without the re-depositing of removed parts. Finally, the support on which the ITO layer was deposited is in no way damaged by etching using a microelectrode.

In particularly advantageous manner, the etching method of the present invention applies not only to ITO layers but also to any electrically conductive metal oxide layer, whether this layer is opaque or transparent such as TCO layers (Transparent Conductive Oxide).

The present invention therefore concerns a method for etching a selected area of a layer of electrically conductive metal oxide deposited on a substrate, consisting in removing said area via electrochemical route in the presence of a polarized microelectrode.

In the present invention, the expressions <<electrically conductive>> and <<conductive>> are equivalent and may be used interchangeably.

By <<method for etching>> is meant a method allowing at least one area of the conductive metal oxide layer to be removed or eliminated to create a pattern, which may be predetermined, in a conductive metal oxide on the surface of the support.

The removed area of the conductive metal oxide layer is advantageously eliminated as far as the surface of the support thereby creating patterns of conductive metal oxide on the surface of the support.

As a variant, the etching of the conductive metal oxide layer may be partial, a simple portion of the thickness of the metal oxide layer being removed with the method of the invention. This variant can be used to obtain a surface of conductive metal oxide with higher roughness thereby increasing the specific surface area.

By <<electrochemical route in the presence of a polarized microelectrode>> in the present invention is meant etching or micro-etching of the conductive metal oxide layer using active species such as radical and/or ionic species, in particular anionic, generated in the electrochemical solution under the action of the polarized microelectrode. These active species are capable of reacting with the metal oxide for the elimination thereof by chemical attack. FIG. 1 schematizes the method of the present invention with a glass support (substrate) coated with an ITO layer (ITO) placed in the presence of an electrochemical solution and a microelectrode such as an ultramicroelectrode (UME), the oxidized form (O) of a compound being reduced to reduced form (R) of this compound at the UME, and the reduced form (R) being oxidized to the oxidized form (O) at the ITO layer.

Having regard to the definition <<electrochemical route in the presence of a polarized microelectrode>> the present invention, in other words, concerns a method for etching a selected area of an electrically conductive metal oxide layer deposited on a support, consisting in removing said area via electrochemical route in the presence of a polarized microelectrode and an electrochemical solution.

The support used in the present invention i.e. the support on whose surface the conductive metal oxide layer is deposited, may be any solid support, natural or synthetic, and used in particular as a support for electrodes. Any non-water soluble support can be used for the present invention, the support possibly being in polymer(s) or in the form of an inorganic layer.

Advantageously the support used in the present invention is an insulating support. Also, this support may be opaque or transparent in the visible and near infrared. By <<transparent in the visible and near-infrared>> in the present invention is meant a material allowing the transmittance of at least 50%, in particular 60%, more particularly at least 70%, and further particularly at least 80% of light having a wavelength of between about 400 and about 1400 nm, and in particular between about 400 and about 800 nm.

More particularly the support used in the present invention is a glass support or flexible substrate transparent in the visible and near infrared such as a substrate in flexible polymer transparent in the visible and the near infrared.

For example, the support used in the present invention is a material chosen from the group consisting of glass, a polycarbonate such as bisphenol A polycarbonate, a polyacrylate such as poly(methyl methacrylate), a polyamide such as nylon, a polyester such as polyethylene terephthalate (PET), a polyarylate, a styrenic, a polyetherimide, a sulfonic polymer, an imide polyether, a polyimide, a polynorbornene, an olefin polymer, a liquid crystalline polymer (LCP) such as polyetheretherketone (PEEK), polyphenylene ether (PPE) or polyphenylene oxide (PPO) and a transparent thermosetting polymer.

The electrically conductive metal oxide used in the present invention may be opaque or transparent in the visible and near infrared. Advantageously, this conductive metal oxide is transparent in the visible and near infrared. For example, the conductive metal oxide used in the present invention is a transparent, conductive oxide (TCO).

The conductive metal oxide used in the present invention is chosen from the group consisting of an optionally doped indium oxide, an optionally doped tin oxide, an optionally doped zinc oxide, an optionally doped cadmium oxide, an optionally doped gallium oxide, an optionally doped thallium oxide, an optionally doped lead oxide, an optionally doped antimony oxide, an optionally doped niobium oxide, an optionally doped tungsten oxide, an optionally doped zirconium oxide, an optionally doped ruthenium oxide, an optionally doped barium oxide, an optionally doped selenium oxide, an optionally doped bismuth oxide, and mixtures thereof.

By <<optionally doped>> is meant a conductive metal oxide also comprising a constituent capable of doping the oxide.

Advantageously, the conductive metal oxide used in the present invention is chosen from the group consisting of fluorine-doped tin oxide ($SnO_2$:F), arsenic-doped tin oxide ($SnO_2$:As), antimony-doped tin oxide ($SnO_2$:Sb), tin-doped indium oxide (ITO) and zinc doped indium oxide (IZO). Further advantageously, the layer of conductive metal oxide used in the present invention is an ITO layer, this layer having a mostly amorphous structure and synthesised in particular from a material composed of a mixture of 90% $In_2O_3$ and 10% $SnO_2$ (weight percentages relative to the total weight of the material).

The conductive metal oxide layer able to be etched with the method of the present invention may be of greater or lesser thickness. This thickness may vary on the support. However, a constant thickness over the entire support is advantageous. In particular, this thickness is between 10 and 1000 nm, more particularly between 20 and 800 nm, further particularly between 50 and 600 nm and most particularly between 100 and 400 nm.

Persons skilled in the art know different techniques which can be used to deposit said layer of conductive metal oxide on a substrate, said layer being in direct contact with the surface of the support. As illustrative, non-limiting examples mention may be made of depositing by cathode sputtering, by ion sputtering and atomic layer deposition (ALD).

In the meaning of the present invention, a <<microelectrode>> (or ME) relates to an electrode of which at least one of the characteristic dimensions (the diameter for a disc) is no more than of the order of a few tens of micrometers. More generally, all the dimensions of a ME have a maximum size of the order of a few tens of micrometers. Among MEs, a distinction can be made between <<ultramicroelectrodes>> (UME) for which one of the characteristic dimensions (diameter for a disc) is no more than of the order of a few tens of nanometers. In general, at least two of the maximum dimensions of an UME are of the order of a few tens of nanometers.

In MEs, the current measured at long time is stationary or near-stationary (logarithmic decay). Ohmic drop is negligible when such electrodes are used. The measured current is constant over time and is dependent on the concentration of redox species.

As microelectrode which can be used in the present invention, it is advantageously possible to make use of the probe of a scanning electrochemical microscope (SECM) or of an atomic force microscope in electrochemical mode (AFM-SECM). Advantageously, use is made of a ME corresponding to the probe of a microscope, having a diameter of less than 200 µm, in particular less than 100 µm, more particularly less than 50 µm and even less than 25 µm. The use of a microelectrode having a diameter of less than 25 µm allows an even further reduction in the width of the etching obtained.

The microelectrode used may have varied forms. It may in particular have a shape corresponding to a disc, sphere, semisphere, micropipette, interdigital comb, cone, ring, concentric rings or a strip. Its shape may therefore correspond to any pattern and can be homothetic on the contours of the area to be etched. Local etching of the ITO layer can therefore be performed using a microelectrode pre-formed in order to directly obtain the desired form.

Therefore, the microelectrode used in the method subject of the present invention is advantageously chosen from the group consisting of an ultramicroelectrode (UME), the probe of a scanning electrochemical microscope (SECM) and the probe of an atomic force microscope in electrochemical mode (AFM-SECM).

The width of the etched area obtained using the method of the present invention is advantageously between 10 μm and 1 cm, in particular between 50 μm and 100 mm, more particularly between 100 μm and 10 mm and further particularly between 100 μm and 1 mm. It is to be noted that it is possible to obtain wider etched areas by conducting several successive, adjacent etchings.

The invention more particularly concerns a method for etching a selected area of a conductive metal oxide layer deposited on a support, comprising the following steps:

a) positioning a microelectrode in the vicinity of the surface of the selected area;

b) contacting an electrochemical solution with at least said selected area;

c) polarizing said microelectrode and optionally said conductive metal oxide layer.

In general, the sequence of steps is either (a), (b) and (c), or (a), (c) and (b).

The positioning of the microelectrode at step a) of the method subject of the present invention is generally obtained by placing the ME vertical to the surface of the area of metal oxide layer to be etched i.e. to be removed. The ME is placed at a nonzero distance relative to the metal oxide layer. This distance is advantageously maintained constant, in particular when the ME is moved over the metal oxide layer.

The distance between the ME and the metal oxide layer is determined using the method usually applied in electrochemical microscopy, by means of an electrochemical mediator corresponding to a known reversible pair (oxidizer, reducer) such as the $Fe^{3+}/Fe^{2+}$ system. A curve is first determined, called an <<approach curve>>, corresponding to the value of the current from the mediator to the ME as a function of the distance between the ME and the metal oxide layer.

The working distance (i.e. the distance between the ME and more particularly between the tip of the ME and the conductive metal oxide layer) chosen to implement the method is the so-called feedback distance where the ME and the surface have interactions. Under these conditions, the ratio between the value of the current intensity measured at the working distance and the intensity of the current measured infinitely i.e. far from the metal oxide layer, is between 1.2 and 20. In general, such a value corresponds to a distance such that the ratio between the working distance and the radius of the ME is between 0.1 and 2, in particular between 0.15 and 1 and more particularly between 0.2 and 0.8. In general, for a ME the diameter of which is between 20 and 150 μm, the working distance will be between 4 and 100 μm, in particular between 8 and 80 μm and typically between 10 and 40 μm.

In a first embodiment, the electrochemical solution, hereinafter also called the electrolytic solution, used in the present invention comprises at least one carboxylic acid.

By <<carboxylic acid>> is meant a chemical compound comprising at least one —COOH group.

In a first variant, this chemical compound only comprises one —COOH group. In this variant, the chemical compound may further comprise an ethylene unsaturation.

In a second variant, this chemical compound comprises at least two —COOH groups and in particular 3 or 4 —COOH groups. In this variant, the chemical compound may further comprise an ethylene unsaturation.

Taking into account these two variants, the carboxylic acid used in the electrochemical solution is chosen from the group consisting of carbonic acid, acetic acid, propanoic acid, butanoic acid, acrylic acid, methacrylic acid, methyl methacrylic acid, ethacrylic acid, alpha-chloroacrylic acid, alpha-cyano acrylic acid, crotonic acid, alpha-phenyl acrylic acid, sorbic acid, alpha-chloro sorbic acid, angelic acid, cinnamic acid, p-chloro cinnamic acid, itaconic acid, citraconic acid, mesaconic acid, glutaconic acid, aconitic acid, fumaric acid, tricarboxy ethylene, oxalic acid, maleic acid, benzene tetracarboxylic acid, 1,2,3,4-butane tetracarboxylic acid and 1,2,3-propane tricarboxylic acid. Advantageously, the carboxylic acid used in the present invention is acrylic acid.

Irrespective of the carboxylic acid used, this acid is present in the electrochemical solution in an amount of between 50 mM and 10 M, in particular between 100 mM and 8 M, more particularly between 500 mM and 6 M and further particularly between 1 and 4 M.

In a second embodiment, the electrochemical solution used in the present invention comprises at least one weak acid. Advantageously, said weak acid has a pKa higher than 4, in particular between 4 and 13 more particularly between 4 and 9.

The pKa value, which corresponds to $-\log_{10}(Ka)$ wherein Ka represents the ionisation constant, of an acid is either known to those skilled in the art since it can be found in reference works, or is accessible experimentally using techniques such as pH-metric techniques in particular well known to those skilled in the art.

As non-limiting examples of weak acids which can be used in the present invention, mention may be made of boric acid, hydrosulfuric acid, pyridinium ion and dihydrophosphate. It is to be noted that some of the previously listed carboxylic acids are also weak acids in the meaning of the present invention.

Irrespective of the weak acid used, it is present in the electrochemical solution in an amount of between 10 mM and 10 M and in particular between 100 mM and 6 M.

In a third embodiment, the electrochemical solution used in the present invention has at least one compound capable of chelating (complexing) at least one metal ion.

This compound is either an entity capable of chelating (complexing) at least one metal ion, or it comprises a group capable of chelating (complexing) at least one metal ion. This entity (or this group) is a neutral molecular structure allowing the complexing of cations i.e. a structure having free doublets, hence containing non-quaternized nitrogen atoms, sulfur atoms or oxygen atoms. Advantageously, an entity (or group) capable of chelating (complexing) at least one metal ion is chosen from the group consisting of a group among amines, amides, ethers, carbonyls, carboxyls, carboxylates, phosphines, phosphine oxides, thio-ethers, disulfides, ureas, crown ethers, aza-crowns, thio-crowns, cryptates, sepulcrates, podands, porphyrins such as tetrakis (benzoic acid)-4,4',",4'''-(porphyrin-5,10,15,20-tetrayl), calixarenes such as calix[4]arene, pyridines, bipyridines, terpyridines, quinolines, orthophenanthroline compounds, naphtols, ethylene glycol, cyclodextrins (CD) such as natural cyclodextrins and derivatives of peranhydrocyclodextrins, as well as molecular structures substituted and/or functionalized from these functional groups, and/or one or more complexing cavities of redox-switch type. For more details on such entities (or groups), those skilled in the art can refer to patent applications FR 2 813 208 and FR 2 851 181 [6, 7].

The compound capable of chelating (complexing) at least one metal ion is present in the electrochemical solution in an amount of between 10 mM and 10 M and in particular between 100 mM and 6 M.

Evidently, the electrochemical solution used in the present invention may contain several elements chosen from among the carboxylic acids, weak acids and compounds capable of chelating (complexing) at least one metal ion such as previously defined.

The electrochemical solution used in the present invention comprises a solvent in the three previously envisaged embodiments. This solvent is advantageously a protic solvent.

By <<protic solvent>> in the present invention is meant a solvent which comprises at least one hydrogen atom capable of being released in proton form.

The protic solvent is advantageously chosen from the group consisting of water and in particular deionized water, distilled water whether or not acidified; hydroxylated solvents such as methanol and ethanol; liquid glycols, particularly those with low molecular weight such as ethyleneglycol, and mixtures thereof. In a first variant, the protic solvent used in the present invention consists solely of a protic solvent or a mixture of different protic solvents. In another variant, the protic solvent or mixture of protic solvents can be used in a mixture with at least one aprotic solvent, provided that this resulting mixture has the characteristics of a protic solvent and in this respect will be considered as such.

More particularly the protic solvent used in the electrochemical solution is chosen from the group consisting of water, deionized water, distilled water, acidified water, acidified deionized water and acidified distilled water.

By <<acidified>> is meant water additionally containing an acid such as hydrochloric acid, nitric acid or sulfuric acid. The amount of acid in the electrochemical solution is between 1 mM and 1 M, in particular between 50 mM and 500 mM and more particularly between 100 mM and 300 mM.

Persons skilled in the art will know how to choose the solvent of the electrochemical solution that is best adapted in relation in particular to the support that is used. Thus, if the support is a glass support, it is possible to use acidified water. On the other hand if the support is in plastic, the presence of acid in the solvent may lead to degradation of the support and preference will be given to non-acidified water.

The work by the inventors has shown that polarization of only the microelectrode at step c) of the method allows cleancut etching to be obtained but it degrades the chemical state of the surface. When working without polarization of the conductive metal oxide layer i.e. when the conductive metal oxide layer is disconnected, this leads to modifications of degradation type over the entire surface of the metal oxide layer (chemical state).

From a mechanistic standpoint, reactive species are generated in the electrochemical solution by electrochemical route via the polarized microelectrode. If the conductive metal oxide layer is not connected i.e. is not polarized, it must exchange electrons with the electrochemical solution over its entire surface. Localised etching is performed but in this case it is coupled with diffuse degradation of the conductive metal oxide layer.

If, on the contrary the conductive metal oxide layer is connected i.e. is polarized even weakly polarized, the electrons brought by this layer pass from the connection on the surface as far as the reaction zone i.e. under the polarized microelectrode without passing across the entire surface. Localised etching is therefore obtained paying heed to the chemical integrity of the surface of the conductive metal oxide layer.

As a result, step (c) of the method according to the present invention has two variants which are:
  a step (c) consisting in polarizing the microelectrode but without polarization of the conductive metal oxide layer;
  a step (c) consisting in polarizing both the microelectrode and the conductive metal oxide layer.

In the present invention, the electric potential applied at step (c) of the method for the microelectrode and optionally for the conductive metal oxide layer is chiefly dependent on the type of electrochemical solution used. It is within the reach of those skilled in the art, once the electrochemical solution is chosen and via routine tests, to determine the electric potential to be applied to the microelectrode and optionally the potential to be applied to the conductive metal oxide layer. These routine tests may consist in measuring either the size (or width) of etching in relation to the potential applied to the microelectrode or optionally to the metal oxide layer, or in measuring the current passing through the working electrodes which are the microelectrode and the metal oxide layer if this layer is polarized. The type of results obtained for such tests are given in appended FIGS. 2 to 4.

As examples, when the conductive metal oxide layer is an ITO layer, the potential applied to the microelectrode may advantageously be higher than 3 V, in particular between 4 and 10 V and more particularly of the order of 7 V (i.e. 7±1 V).

As examples, if the conductive metal oxide layer is an ITO layer, a low potential is applied to this layer; advantageously it may be higher than −1 V, particularly between 0 and −1 V and more particularly of the order of −0.1 V (i.e. −0.1±0.05 V).

The polarization of the microelectrode and optionally of the metal oxide layer can be conducted using any technique known to persons skilled in the art and in particular under conditions of linear or cyclic voltamperometry, under potentiostatic, potentiodynamic, intensiostatic, galvanostatic, galvanodynamic conditions or by static or pulsed chronoamperometry. Advantageously, the method of the present invention is conducted under static or pulsed chronoamperometry conditions. In static mode, the microelectrode and/or optionally the metal oxide layer are polarized for a time of generally less than 5 sec, more generally for 2 sec. In pulsed mode, the number of pulses is preferably between 2 and 100 and more preferably between 1 and 20, their length generally being 5 to 250 ms, typically 100 ms.

In the present invention, the polarized microelectrode is able to operate in static or dynamic mode allowing spot-type etching or linear-type etching respectively.

Therefore according to one particular embodiment, the method comprises an additional step to move the microelectrode close to the selected area of the conductive metal oxide layer. Advantageously, this additional step (d) is carried out after the sequence of steps (a), (b) and (c) or (a), (c) and (b). This step is useful when the selected area to be etched has a substantially larger surface area than the surface area of the ME. According to this modality, it is therefore possible, in the conductive metal oxide layer, to etch selected areas corresponding to complex extensive patterns compared with the size of the ME.

The microelectrode can be moved at continuous or variable rate over time, one condition to be heeded being the speed of operation allowing etching of sufficient quality and in particular uniform etching to be obtained. This speed may notably range from 10 to 1000 μm/sec, in particular from 50 to 700 μm/sec and more particularly from 100 to 500 μm/sec.

This objective (i.e. etching of complex, extensive patterns compared with the size of the ME) can also be achieved by using several microelectrodes positioned in the vicinity of the conductive metal oxide layer to be etched. The distance between the microelectrodes is to be chosen in relation to the complex patterns to be obtained. The simultaneous use of several microelectrodes when implementing the method makes it possible to rapidly obtain complex etched patterns on one same surface. The same or different electrochemical solutions can be used in this variant. Advantageously a single electrochemical solution is used.

Of notable interest is the fact that the inventors have ascertained that the method of the present invention can be applied to a multi-layer support. Indeed, the support may effectively have not only a conductive metal oxide layer directly deposited on the support, but also at least one other layer of a conductor, semiconductor or insulating material deposited on this conductive metal oxide layer.

The implementing of this method, in this case, allows the etching of the conductive metal oxide layer and of the other layer of material, whereas the etching of a layer of insulating, semiconductor or conductor material directly deposited on the support i.e. without a conductive metal oxide layer may not always be possible with the method of the invention.

The layer(s) deposited on the conductive metal oxide layer is (are) thin layer(s). It (or they) has (have) a thickness which may vary over the entire surface of the conductive metal oxide layer. However, a constant thickness over the entire surface of the conductive metal oxide layer is advantageous. In particular this thickness is between 10 and 1000 nm, more particularly between 20 and 800 nm, further particularly between 50 and 600 nm and most particularly between 100 and 400 nm.

As examples of insulating, semiconductor or conductor materials which may be deposited on the conductive metal oxide layer, mention may be made of n-type or p-type semiconductors, chosen in particular from the group consisting of titanium oxide ($TiO_2$), nickel oxide (NiO), optionally doped indium oxide, optionally doped zinc oxide, optionally doped tin oxide, optionally doped cadmium oxide, optionally doped gallium oxide, optionally doped thallium oxide, optionally doped lead oxide, optionally doped antimony oxide, optionally doped magnesium oxide, optionally doped titanium oxide, optionally doped niobium oxide, optionally doped tungsten oxide, zirconium oxide and mixtures thereof; graphite fluoride, silicon oxide; silicon nitride; an organic material, chosen in particular from the group consisting of photo-emitting materials such as 8-hydroxy-quinoline complexing a metal ($ZnQ_2$, $AlQ_3$) or polyaniline; charge injection materials such as 4,4'-Bis{N-phenyl-N-(4-methylphenyl) amino}biphenyl, 2, or 4-[N-(4-Hydroxymethylphenyl)-N-(4-methylphenyl)amino]-4'-[Nphenyl-N-4-methylphenyl) amino]biphenyl, 4; polymers, zeolites and nanotubes.

Those skilled in the art know different protocols which can be used to obtain the depositing of a layer of material such as previously defined on a conductive metal oxide layer. As illustrative, non-limiting examples of such protocols mention may be made of spin-coating, casting, electrografting, chemical grafting and vapour deposition.

The method of the invention is conducted at a temperature of between 4 and 50° C., in particular between 10 and 40° C., more particularly between 20 and 30° C. and further particularly at ambient temperature. By <<ambient temperature>> in the present invention is meant a temperature of 22° C.±3° C.

The method of the present invention can be performed in particular in an electrolytic cell comprising different electrodes: a first working electrode corresponding to the metal oxide layer (if this layer is polarized), a second working electrode corresponding to the microelectrode, a counter electrode such as platinum foil and a common reference electrode such as silver wire.

According to one particular arrangement, several microelectrodes can be used simultaneously above one same conductive metal oxide layer.

The method of the present invention can be used for the fabrication of electrodes or conductive elements in various fields. For example in the glass-making sector the present invention can be used to fabricate conductive networks to heat glass panes via Joule effect or glass panes incorporating antennas.

The present invention can also be applied in the photovoltaic cell industry and in the electronics industry for the fabrication of front or back faces of emitting screens of flat screen type, plasma screens or touch screens and more generally any type of screen/glass surface able to receive, transmit or emit radiation, visible light in particular.

The invention also concerns the use of a microelectrode for etching a selected area of a conductive metal oxide layer in particular such as defined, deposited on a support. More particularly the present invention concerns the use of a microelectrode for etching a selected area of a layer of conductive metal oxide in particular such as defined, deposited on a support and placed in the presence of an electrochemical solution, in particular such as previously defined.

The present invention also concerns a layer of etched conductive metal oxide able to be obtained by etching a conductive metal oxide layer deposited on a substrate using a method conforming to the invention. Indeed, if the metal oxide layer is polarized (i.e. connected), the etched layer maintains all the characteristics of the starting conductive metal oxide layer and exhibits clean-cut etching both at the edges and at etching depth and on this account therefore differs from other etched layers obtained using the methods of the state of the art.

The invention will be better understood on reading the following examples which refer to the appended Figures. The sole purpose of these examples is to illustrate the present invention and they are not in any way to be construed as limiting the scope thereof.

BRIEF DESCRIPTION OF THE DRAWINGS

FIG. 9 illustrates a wire (or line in relief) of ITO generated by etching an ITO layer using the method of the invention.

DETAILED DESCRIPTION OF CERTAIN ILLUSTRATIVE EMBODIMENTS

Figure 1:
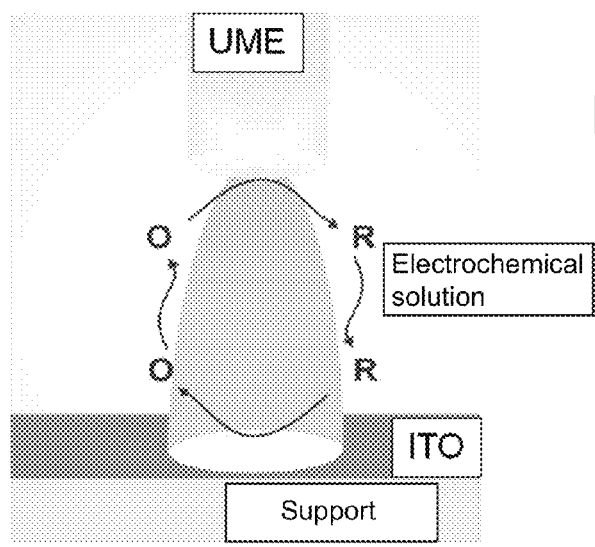
FIG. 1 is a schematic illustration of the method of the present invention on which it has already been commented.

1. Lithography Protocol.

A layer of ITO of thickness 200 nm (15 Ω/square) was deposited on a glass strip and then etched to pattern an electric circuit. As a variant, an ITO layer of thickness 250 nm was deposited on a membrane of polyethylene terephthalate (PET).

Different potentials applied to the ITO layer and to the microelectrode were tested (item 4 below). For the other experiments, the SECM microelectrode (UME) was polarized with the Bipotentiostat to a high positive potential of 7 V, and the ITO surface was polarized to −0.1 V.

Different working distances i.e. distances between the tip of the microelectrode and the ITO layer were tested (item 3 below).

The surface on which the polarized ITO layer was deposited was immersed in a solution for which different compositions were tested (see item 2 below). This solution also contained a common reference electrode (RE, silver wire) and a counter-electrode (CE, platinum foil).

Under these conditions, the microelectrode was able to be moved at a rate of 300 μm/sec to obtain uniform etching on the glass coated with ITO. It was verified that the etched area had an insulating nature typical of glass, which confirms the full removal of the ITO layer on this area.

2. Tested Electrochemical Solutions.

2.1. Chemical Composition of the Tested Solutions.

Different electrochemical (or electrolytic) solutions having water as solvent were tested. Table 1 below gives the compositions of these solutions.

TABLE 1

| Solution | $K_2SO_4$ | $H_2SO_4$ | AA[1] | AAc[2] | HEMA[3] | $d_n$[4] |
|---|---|---|---|---|---|---|
| 1 | 0.25M | | | | | 12.8 |
| 2 | | 0.25M | | | | 8 |
| 3 | | | 2M | | | 2 |
| 4 | 0.25M | | 2M | | | 5.6 |
| 5 | | 0.25M | 2M | | | 5 |
| 6 | | 0.25M | | 2M | | 5 |
| 7 | 0.25M | | | | 2M | 11.6 |

[1]Acrylic acid
[2]Acetic acid
[3](2-hydroxyethyl) methacrylate
[4]Width/radius$_{UME}$ 2.2. Results Obtained with the Different Tested Solutions.

An acid solution only containing sulfuric acid ($H_2SO_4$) is not capable of removing all the material in the cavity generated during etching. The form-factor $d_n$ is defined as the width of etching over the radius of the microelectrode UME used: $d_n$=width/radius$_{UME}$. If the aqueous solution used only contains sulfuric acid the $d_n$ value is high since it is 8 for 7 V applied to the microelectrode.

If the aqueous solution contains both sulfuric acid (0.25 M) and acrylic acid (2 M) (solution 4), the efficacy of this solution is clearly apparent given the homogeneity and precision of the etched pattern. In the treated area, no appreciable residue was observed and the $d_n$ value was 5 for an application of 7 V.

To test the contribution of each of the elements of solution 4, solution 5 in which acrylic acid was replaced by acetic acid was prepared. Using acetic acid, the carboxylic group is maintained whereas the vinyl influence is lost. In this case, the size of etching was equivalent since d, was 5, however residual material remained on the edges of the generated cavity.

Acrylic acid therefore makes it possible to obtain better results essentially due to the elimination of ITO residues during etching. Without intending to be bound by any theory, acrylic acid would appear to play a complexing role towards the indium and tin released during etching.

3. Electrochemical Observations.

Different potentials applied to the electrodes were tested over the range 1 to 10 V for the microelectrode UME and over the range of 0 to −0.5 V for the ITO layer.

Figure 2:
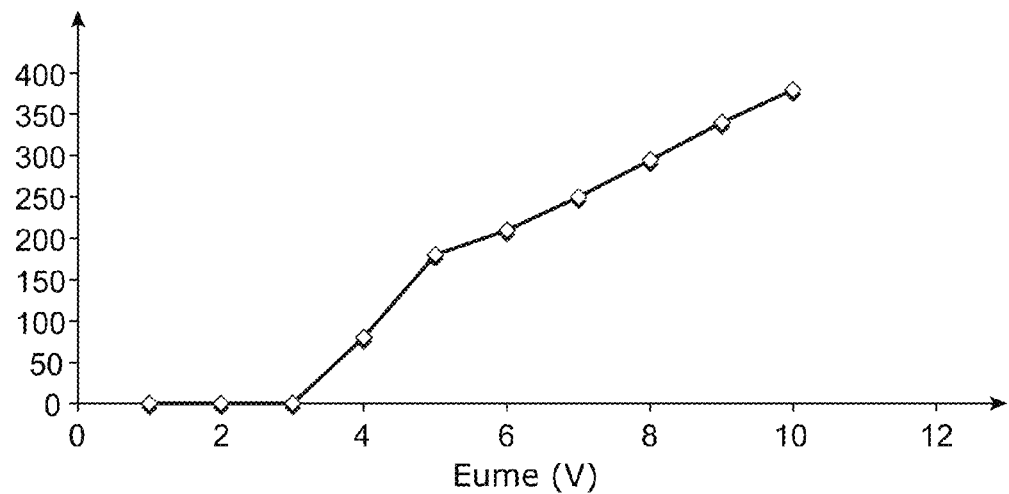
FIG. 2 illustrates the width of the etching of the ITO layer expressed in μm, as a function of the potential applied to the microelectrode ($E_{ume}$) expressed in V.
Figure 3:
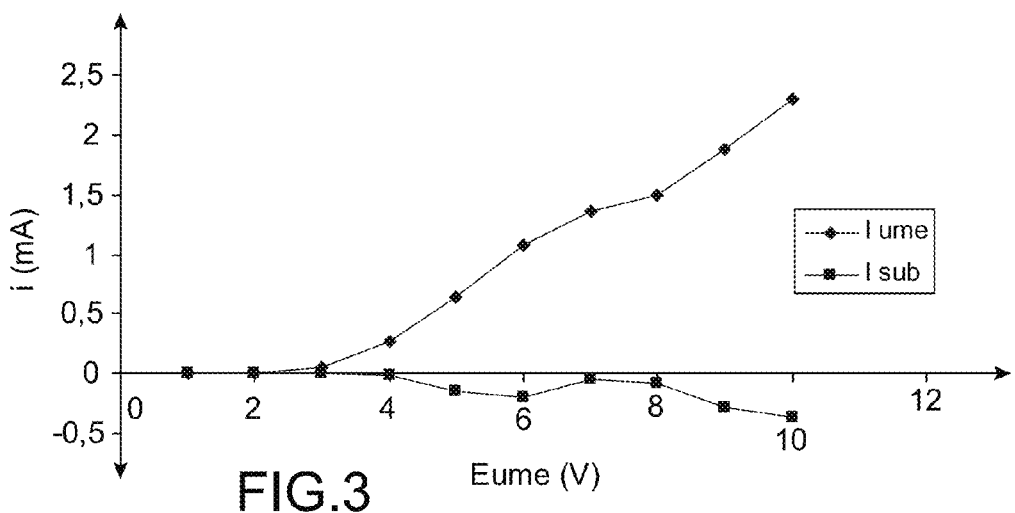
FIG. 3 illustrates the current expressed in mA passing through the electrodes formed by the microelectrode ($I_{ume}$) and the substrate i.e. the ITO layer ($I_{SUB}$) as a function of the potential applied to the microelectrode ($E_{ume}$) expressed in V.

Analysis of the size (or width) of etching as a function of the potential applied to the microelectrode UME shows that the method starts at a potential of 3 V (FIG. 2). This information is confirmed by analysis of the current through the electrodes (FIG. 3).

Figure 4:
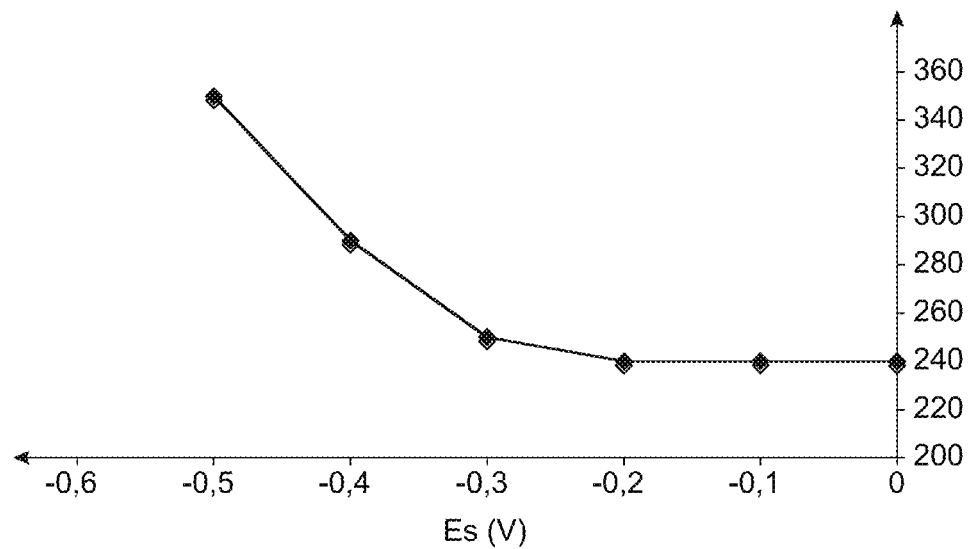
FIG. 4 illustrates the width of the etched area of the ITO layer expressed in μm, as a function of the potential applied to the surface i.e. to the layer of ITO ($E_s$) expressed in V.

The analysis of the size of etching as a function of the potential applied to the ITO layer shows that the more the potential is negative the greater the size (FIG. 4). Potentials more negative than −1 V applied to the ITO layer generate definitive degradation of the surface.

Figure 5:
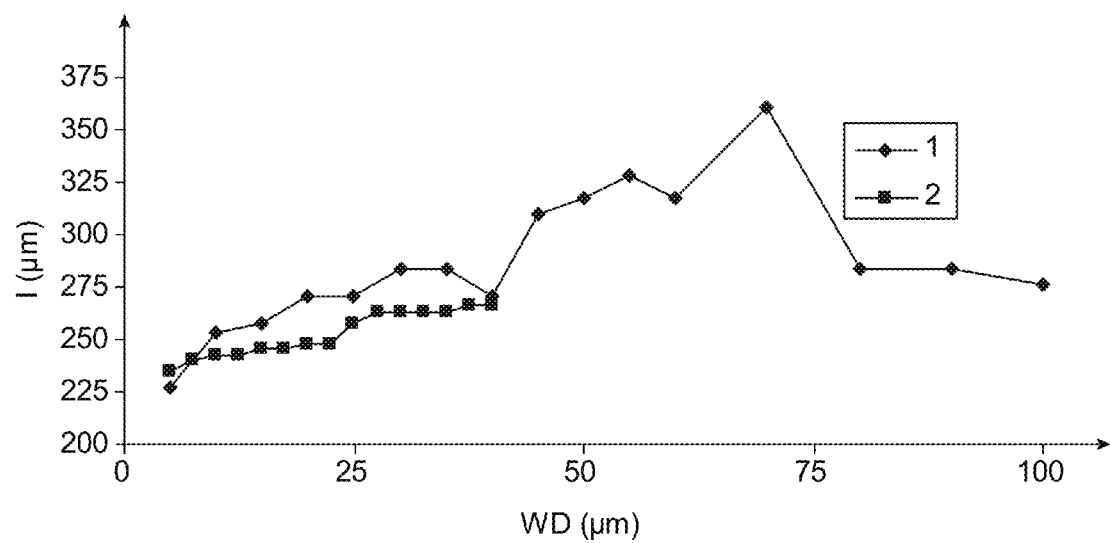
FIG. 5 illustrates the width of the etched area (1) expressed in μm, as a function of the working distance (WD) between the microelectrode and the ITO layer expressed in μm. The values are given for two independent experiments (1) and (2).
Figure 6:
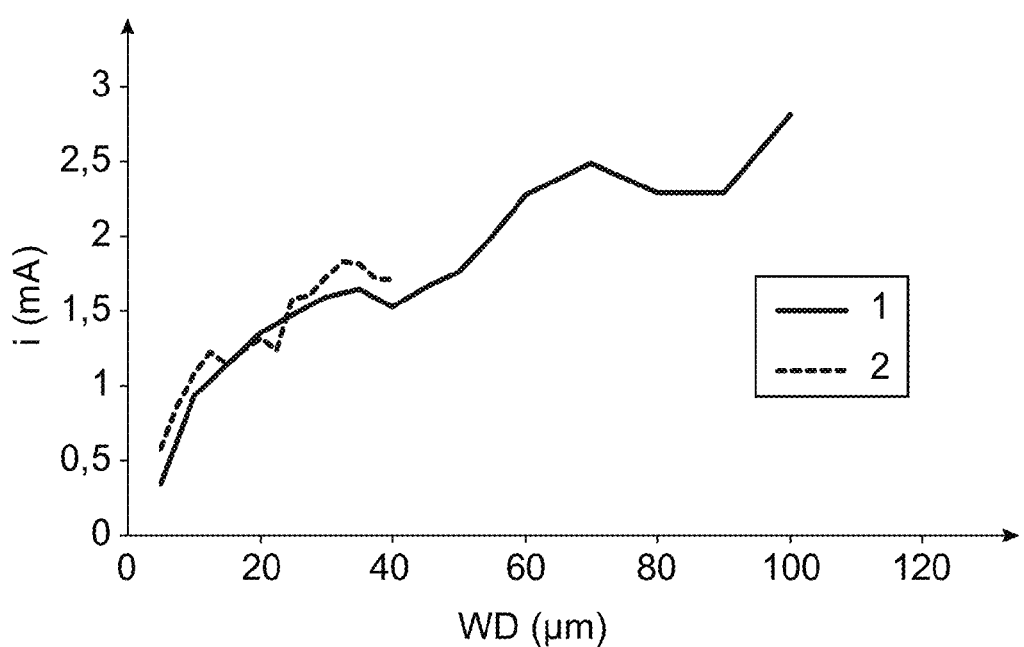
FIG. 6 gives the quantity of current (I) measured in the microelectrode expressed in mA, as a function of the working distance (WD) between the microelectrode and the ITO layer expressed in μm. The values are given for two independent experiments (1) and (2).

Different working distances i.e. distance between the microelectrode UME and the ITO layer were tested, a potential of 7 V and a potential of −0.1 V being applied respectively to the microelectrode UME and the ITO layer. In addition, the experiment was repeated twice to assess repeatability. The results given in FIG. 5 show the thickness of the etched area as a function of the working distance, and the repeatability of the results obtained. Similarly, this repeatability can also be evidenced by measuring the passing of current as a function of the working distance (FIG. 6).

4. Patterning.

A series of patterns was produced to test reproducibility, resolution and electric performance levels.

Morphological and chemical characterizations allowed the determination of the efficacy of the method of the present invention. The clean cut of the edges and at depth (support surface) of the etched area was verified by X photoelectron spectroscopy (XPS) and atomic force microscopy (AFM).

X photoelectron spectroscopy (XPS) is the best technique for determining the different atomic concentrations at a depth of 10 nm in a surface. Table below gives the atomic percentages for different elements measured at the area etched using the method of the present invention (Etched area) and at the ITO layer deposited on glass and surrounding the etched area (Surrounding area).

TABLE 2

| Element | Etched area | Surrounding area |
| --- | --- | --- |
| O | 52.8 | 33.6 |
| Sn | 0.1 | 2.2 |
| In | 0.4 | 20.4 |
| N | 2.4 | 0.6 |
| C | 13.2 | 41.9 |
| Si | 31.1 | 1.2 |

The etched area has a composition typical of glass, whereas the area surrounding this etched area has an unchanged ITO composition.

Figure 7:
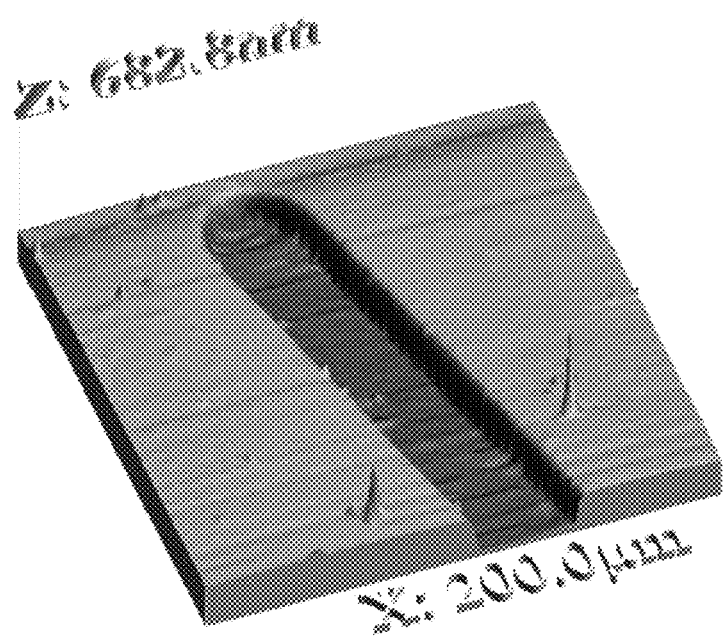
FIG. 7 gives an atomic force microscope image of an ITO layer deposited on glass and etched using the etching method of the present invention.

The AFM image shown in FIG. 7 confirms the clean cut of the etched area and of the edges. The 200 nm edge is substantially vertical and free of any impurity resulting from the method. The clean cutting is maintained in the etched area and in the region surrounding the etched area, guaranteeing the best performance of the electric equipment.

Figure 8:
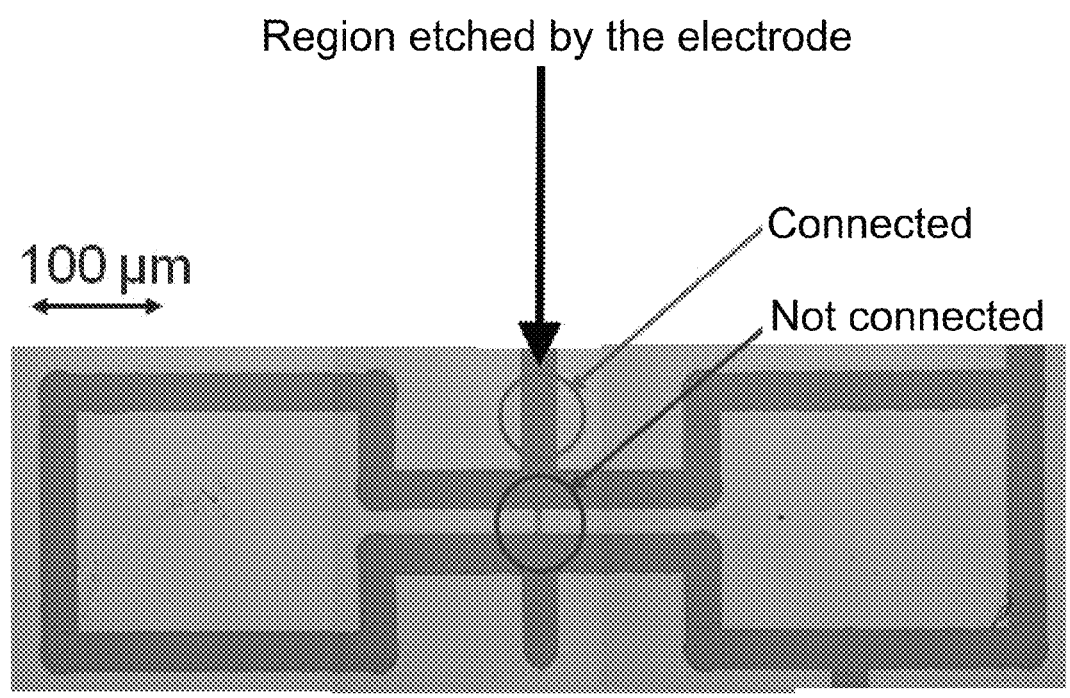
FIG. 8 shows two conformations used when etching the ITO layer, with the ITO layer that is either connected or disconnected.

Therefore two different modes can be used in circuits: with an ITO region connected or with an ITO region disconnected (FIG. 8). The disconnection of the substrate or part thereof will lead to a passive change in the potential of the substrate. The surface will lose its electrode role and modifications will occur via the bombarding of species derived from the ME.

With the insulating of the working region (disconnected mode) good localization of the etching is obtained since d, is 2.5. However, the surface is modified: it has lost some of its initial physicochemical characteristics namely either loss of transparency or loss of electric conductivity, or both.

Resolution was tested in the two modes.

When the method is implemented with a connected surface, it is more reproducible.

In the second approach (disconnected mode) it is more difficult to maintain good uniformity of the etched area. This approach remains usable however.

Different geometries were tested to examine the etching method according to the present invention.

It is possible, on a support coated with an ITO layer, to insulate a square of ITO by etching a square area using the method of the invention. The support was subjected to electrografting with a molecule able to be detected such as a photosensitizer based on a Ru(II) polyazaheterocyclic complex. The results obtained show that this electrografting is only possible on the polarized ITO region surrounding the square. Since the ITO square is insulated, it is no longer subjected to polarization and cannot undergo electrografting. Electrografting is only possible provided the ITO square is directly polarized.

With the method of the invention it is possible to insulate ITO domains, and more generally domains of conductive metal oxide. These domains can be electrografted with separate polymers to create a surface with separate functionalised patterns.

Figure 9A:
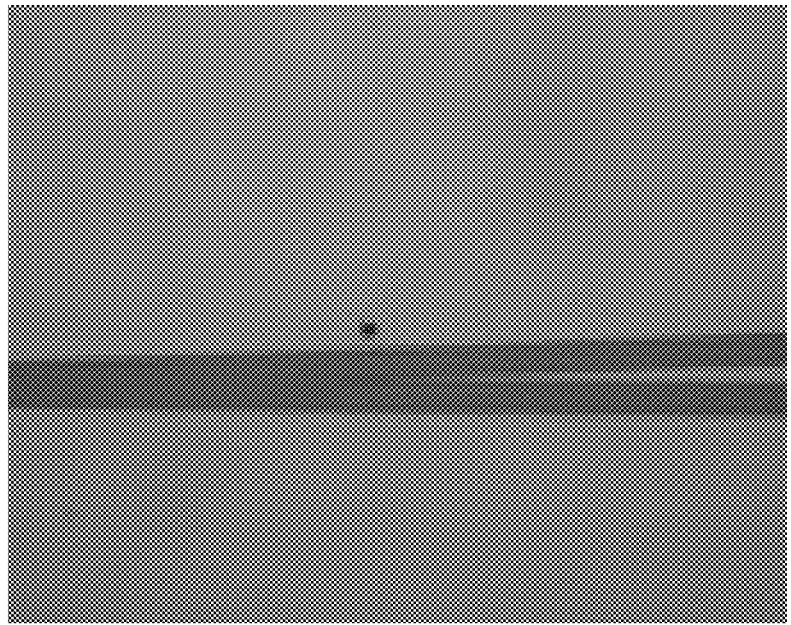
FIG. 9A illustrates the two etched areas having a relative angle of 3° generating a space which defines the ITO wire.
Figure 9B:
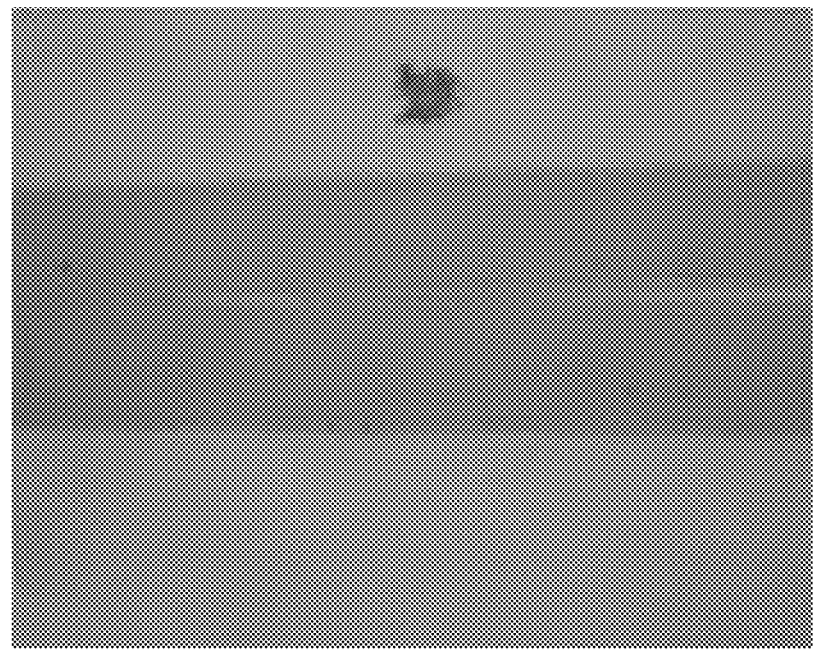
FIG. 9B is a detail of this space generated by the two etched areas i.e. a detail of the ITO wire.

When using the connected mode, two etch lines with a relative angle of about 3° were obtained by etching the ITO layer (FIG. 9A). The finest possible ITO wire able to be obtained with a microelectrode UME of 25 μm was created at the intersection of the two etched lines (FIG. 9B).

The maximum resolution of the ITO wire thus obtained was examined under an atomic force microscope (AFM). The continuity of the wire is guaranteed up to a width of 10 μm and even up to 3 μm.

Figure 10:
FIG. 10 gives an example of an etched pattern using the etching method of the present invention, and the application thereof for forming an OLED (Organic Light Emitting Diode).

An example of an etched pattern using a method according to the present invention and its application as OLED is illustrated in FIG. 10. Lithography, assisted by patterning software to create the pattern, was carried out by SECM on an ITO layer deposited on glass according to the present invention. The surface of the pattern was one square centimeter. After completing etching, evaporation of the organic layers enabled us to produce an OLED according to the method described in [5].

REFERENCES

[1]. Article by Cheng et al., <<ITO patterning by a low power Q-switched green laser and its use in the fabrication of a transparent flow meter>> J. Micromech. Microeng. 17 (2007) 2316-2323.

[2]. Article by Wang et al., <<Toward mimicking biological vision with protein-based flexible imaging arrays>> SPIE Newsroom (2006) DOI: 10.1117/2.1200611.0468.

[3]. Article by Huang et al., <<The effect of solvent on the etching of ITO electrode>> Materials Chemistry and Physics, 84 (2004) 146-150.

[4]. Article by Chen et al., <<Laser direct write patterning technique of indium tin oxide film>> Thin Solid Films, 515 (2007) 8515-8518.

[5]. Article by Zucchi et al., <<White electroluminescence of lanthanide complexes resulting from exciplex formation>> J. Mater. Chem., 20 (2010) 2114-2120.

[6]. Patent application FR 2 813 208 <<Structure complexante, dispositif et procédé traitement d'effluents liquides>> (*Complexing structure, device and method for treating liquid effluent*) filed by CEA and published on 1 Mar. 2002.

[7]. Patent application FR 2 851 181 <<Procédé de revêtement d'une surface>> (*Method for coating a surface*) filed by CEA and published on 20 Aug. 2004.

What is claimed is:

1. A method for etching a selected area of a conductive metal oxide layer deposited on a support, comprising removing said area via electrochemical route in the presence of a polarized microelectrode and an electrochemical solution, wherein the electrochemical solution comprises at least one chemical compound comprising at least one —COOH group and an ethylene unsaturation.

2. The method according to claim 1, wherein said conductive metal oxide is a transparent conductive oxide (TCO).

3. The method according to claim 1, wherein said conductive metal oxide is selected from the group consisting of an optionally doped indium oxide, optionally doped tin oxide, optionally doped zinc oxide, optionally doped cadmium oxide, optionally doped gallium oxide, optionally doped thallium oxide, optionally doped lead oxide, optionally doped antimony oxide, optionally doped niobium oxide, optionally doped tungsten oxide, optionally doped zirconium oxide, optionally doped ruthenium oxide, optionally doped barium oxide, optionally doped selenium oxide, optionally doped bismuth oxide, and mixtures thereof.

4. The method according to claim 1, wherein said conductive metal oxide is tin-doped indium oxide (ITO).

5. The method according to claim 1, wherein said microelectrode is selected from the group consisting of an ultramicroelectrode (UME), a probe of a scanning electrochemical microscope (SECM) and a probe of an atomic force microscope in electrochemical mode (AFM-SECM).

6. The method according to claim 1, wherein said removing comprises the following steps:
   a) positioning said microelectrode close to the surface of the said selected area;
   b) contacting said electrochemical solution with at least said selected area; and c) polarizing said microelectrode,
the sequence of steps being either (a), (b) and (c), or (a), (c) and (b).

7. The method according to claim 1, wherein said removing comprises the following steps:
   a) positioning said microelectrode close to the surface of the said selected area;
   b) contacting said electrochemical solution with at least said selected area; and
   c) polarizing said microelectrode and said conductive metal oxide layer,
the sequence of steps being either (a), (b) and (c), or (a), (c) and (b).

8. The method according to claim 1, wherein said electrochemical solution comprises a protic solvent.

9. The method according to claim 1, wherein the conductive metal oxide layer being an ITO layer, the potential applied to the microelectrode is higher than 3 V.

10. The method according to claim 7, wherein the conductive metal oxide layer being an ITO layer, the potential applied to the said ITO layer is higher than −1 V.

11. The method according to claim 1, wherein it comprises an additional step to move the microelectrode close to the selected area of the conductive metal oxide layer.

12. The method according to claim 1, wherein said support not only has a conductive metal oxide layer deposited on the support, but also at least one other layer of conductor, semiconductor or insulating material deposited on this conductive metal oxide layer.

13. A conductive metal oxide layer etched using the method defined in claim 7.

14. The method according to claim 6, wherein, in c), the microelectrode and the conductive metal oxide layer are polarized.

15. The method according to claim 1, wherein said electrochemical solution comprises at least one element selected from the group consisting of acrylic acid, methacrylic acid, methyl methacrylic acid, ethacrylic acid, alpha-chloroacrylic acid, alpha-cyano acrylic acid, crotonic acid, alpha-phenyl acrylic acid, sorbic acid, alpha-chloro sorbic acid, angelic acid, cinnamic acid, p-chloro cinnamic acid, itaconic acid, citraconic acid, mesaconic acid, glutaconic acid, aconitic acid, fumaric acid, tricarboxy ethylene, oxalic acid, maleic acid, benzene tetracarboxylic acid, 1,2,3,4-butane tetracarboxylic acid and 1,2,3-propane tricarboxylic acid.

16. The method according to claim 8, wherein said protic solvent is selected from the group consisting of water, deionized water, distilled water, acidified water, acidified deionized water and acidified distilled water.

17. The method according to claim 9, the potential applied to the microelectrode is higher between 4 V to 10 V.

18. The method according to claim 9, the potential applied to the microelectrode is the order of 7 V.

19. The method according to claim 10, wherein the potential applied to the said ITO layer is between 0 V and −1 V.

20. The method according to claim 10, wherein the potential applied to the said ITO layer is the order of −0.1 V.

* * * * *